US 8,052,886 B2

(12) United States Patent
Maruyama

(10) Patent No.: US 8,052,886 B2
(45) Date of Patent: Nov. 8, 2011

(54) PLASMA ETCHING METHOD AND APPARATUS THEREFOR

(75) Inventor: Koji Maruyama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 686 days.

(21) Appl. No.: 12/234,417

(22) Filed: Sep. 19, 2008

(65) Prior Publication Data

US 2009/0045167 A1    Feb. 19, 2009

Related U.S. Application Data

(62) Division of application No. 11/390,448, filed on Mar. 28, 2006, now Pat. No. 7,442,274.

(60) Provisional application No. 60/666,713, filed on Mar. 31, 2005.

(30) Foreign Application Priority Data

Mar. 28, 2005   (JP) ................................. 2005-092354

(51) Int. Cl.
*G01L 21/30* (2006.01)
*B44C 1/22* (2006.01)
(52) U.S. Cl. ................. 216/60; 216/58; 216/59; 216/67
(58) Field of Classification Search .................... 216/58, 216/59, 60, 67
See application file for complete search history.

(56) References Cited

U.S. PATENT DOCUMENTS

| | | | |
|---|---|---|---|
| 4,330,384 A * | 5/1982 | Okudaira et al. | 204/192.37 |
| 4,377,436 A * | 3/1983 | Donnelly et al. | 438/16 |
| 4,908,292 A | 3/1990 | Ide et al. | |
| 5,200,028 A | 4/1993 | Tatsumi | |
| 5,246,529 A | 9/1993 | Fukasawa et al. | |
| 6,160,621 A | 12/2000 | Perry et al. | |
| 6,200,822 B1 * | 3/2001 | Becker et al. | 438/9 |
| 6,303,512 B1 * | 10/2001 | Laermer et al. | 438/712 |
| 6,846,424 B2 | 1/2005 | Baum et al. | |
| 6,939,472 B2 | 9/2005 | Schaadt et al. | |
| 7,201,852 B1 * | 4/2007 | Spitz et al. | 216/63 |
| 2003/0147652 A1 | 8/2003 | Green et al. | |
| 2007/0221258 A1 | 9/2007 | Saito et al. | |

* cited by examiner

*Primary Examiner* — Shamim Ahmed
(74) *Attorney, Agent, or Firm* — Oblon, Spivak, McClelland, Maier & Neustadt, L.L.P.

(57) ABSTRACT

A fluorine-containing compound gas, e.g., $SF_6$ gas, is converted into a plasma and a silicon portion of an object to be processed is etched by the plasma. At the same time, using a light source having a peak intensity of light in a wavelength range of light absorption of a reaction product, e.g., $SiF_4$, for which, to be more precise, ranges from 9 μm to 10 μm, the light is irradiated onto a surface of an object to be processed from the light source. The $SiF_4$ molecules absorb the light, become activated and gain kinetic energy to be used in gaining an easy escape from a hole. As a consequence, an amount (a partial pressure) of fluorine radicals (F*) used as an etchant is increased and an etching rate of a silicon is increased.

8 Claims, 6 Drawing Sheets

A LIGHT ABSORPTION SPECTRUM OF SiF$_4$

A LIGHT ABSORPTION SPECTRUMS OF SF$_6$ AND SF$_4$

PLASMA ETCHING METHOD AND APPARATUS THEREFOR

CROSS-REFERENCE TO RELATED APPLICATIONS

The present application is a Division of U.S. application Ser. No. 11/390,448, filed Mar. 28, 2006, U.S. Pat. No. 7,442,274 which claims the benefit of Provisional Application Ser. No. 60/666,713 filed Mar. 31, 2005, and claims priority to Japanese Application 2005/092354, filed Mar. 28, 2005, each of which is hereby incorporated herein by reference in its entirety but to the extent that such incorporation does not raise an issue of new matter.

FIELD OF THE INVENTION

The present invention relates to a plasma etching method and an apparatus for converting a process gas including a fluorine-containing compound gas into a plasma and etching a silicon portion of an object to be processed with the plasma.

BACKGROUND OF THE INVENTION

Recently, a three-dimensional package device having a three-dimensional device structure has been developed. This three-dimensional package device is highly efficient in terms of space usage and is obtained by stacking single-crystal silicon (Si) substrates or the like having, e.g., logic or memory functions, to form a multi layered structure, and connecting the layers with interconnections.

To realize three-dimensional package device, the interconnection through holes, diameters thereof ranging between 10 μm and 70 μm, must be formed in the silicon substrates, thickness thereof ranging between 100 μm and 200 μm, and this requires very high-rate etching.

There is disclosed in Japanese Patent Laid-open Publication No. 2002-093776 (paragraph 0034, 0037) a method for realizing a high-rate silicon etching of about 20 μm/min by using a gas having a large number of Fs in one molecule, e.g., $SF_6$ (sulfur hexafluoride) or $S_2F_{10}$ (disulfur decafluoride), as a fluorine-containing compound gas and by converting the gas into a plasma with a gas pressure in a process chamber being set as high as 13 pa to 1,333 pa (100 mTorr to 10 Torr) to generate a sufficient amount of radicals therefor.

However, when a silicon portion is etched by using $SF_6$, $SiF_4$s (silicon tetrafluoride) are produced as an etching reaction product as a consequence of fluorine radicals reacting with Si, as shown in the following reaction equation 1:

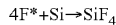

$$4F^* + Si \rightarrow SiF_4 \quad \text{[Reaction Equation 1]}$$

The $SiF_4$s produced in the holes are emitted from the holes. However, when an etching rate of the silicon reaches several tens of μm/min, an amount of etching reaction product emitted from the holes becomes as large as that of fluorine radicals which are supplied into the holes, as a consequence of the $SiF_4$s formed thereinside correspondingly increasing. This increase in a partial pressure of $SiF_4$s inside the holes limits increasing of a partial pressure of fluorine radicals, resulting in preventing the etching speed (etching rate) from further being increased.

In addition, Japanese Patent Laid-open Publication NO. S61-032429 (page 2) discloses an etching method in which the silicon portion is etched by using $SF_6$ gas as a process gas, wherein a partial pressure of the gas is set to 50 Pa and $SF_6$ molecules are vibrated and excited with $CO_2$ laser of 10 kw, but it is deficient in that it does not disclose an etching method for etching the silicon portion at high etching rate of more than 20 μm/min.

The present invention is invented according to the above circumstances, the object of the present invention is to provide a plasma etching method and an apparatus capable of etching silicon at a high rate when etching a portion of an object to be processed.

SUMMARY OF THE INVENTION

It is, therefore, an object of the present invention to provide a plasma etching method and an apparatus capable of etching silicon at a high rate when etching a portion of an object to be processed.

In accordance with a first aspect of the present invention, there is provided a plasma etching method, the method including: converting a process gas including a fluorine-containing compound gas into a plasma; and etching a silicon portion of an object to be processed with the plasma, wherein a light having a peak intensity of light in a wavelength range of light absorption of a reaction product produced by an etching is irradiated onto a surface of the object to be processed.

It is preferable that the reaction product is silicon tetrafluoride ($SiF_4$) and the wavelength range of light absorption is from 9 μm to 10 μm.

Moreover, it is preferable that the fluorine-containing compound gas includes at least one of $SF_6$ or $S_2F_{10}$.

It is also preferable that the process gas includes oxygen gas.

In accordance with another aspect of the present invention, there is provided a plasma etching apparatus for etching a silicon portion of an object to be processed mounted on a susceptor with a plasma which is obtained by converting a process gas including a fluorine-containing compound gas thereinto in an airtight process chamber, the apparatus including: a light source which emits a light having peak intensity of light in a wavelength range of light absorption of a reaction product between the fluorine-containing compound and silicon, and irradiates the light onto a surface of the object to be processed mounted on the susceptor; and a gas supply unit introducing the process gas into the process chamber.

It is preferable that the light source is disposed outside the process chamber; and the gas supply unit includes gas inlet holes for introducing the process gas into the process chamber and light transmitting windows for transmitting a light from the light source into the process chamber; and the gas inlet holes and the light transmitting windows are formed in surface of the gas supply unit facing the susceptor.

Besides, it is preferable that the light transmitting windows have a function of a band-pass filter, selectively transmitting a light in a wavelength range of light absorption.

According to present invention, the silicon portion of the object to be processed is etched with the plasma which is obtained by converting the $SF_6$ gas and oxygen gas into a plasma, and at the same time, by irradiating the etching reaction product on the surface of the object to be processed, e.g., $SiF_4$, with a light in a wavelength range of light absorption thereof allowing the etching reaction product to absorb the light, be activated and gain kinetic energy to be used in promptly escaping from the hole. Thus, because an amount (a partial pressure) of the etching reaction product can be decreased in the hole, an amount (a partial pressure) of an etchant can be increased and this will result in an etching rate of the silicon being increased.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
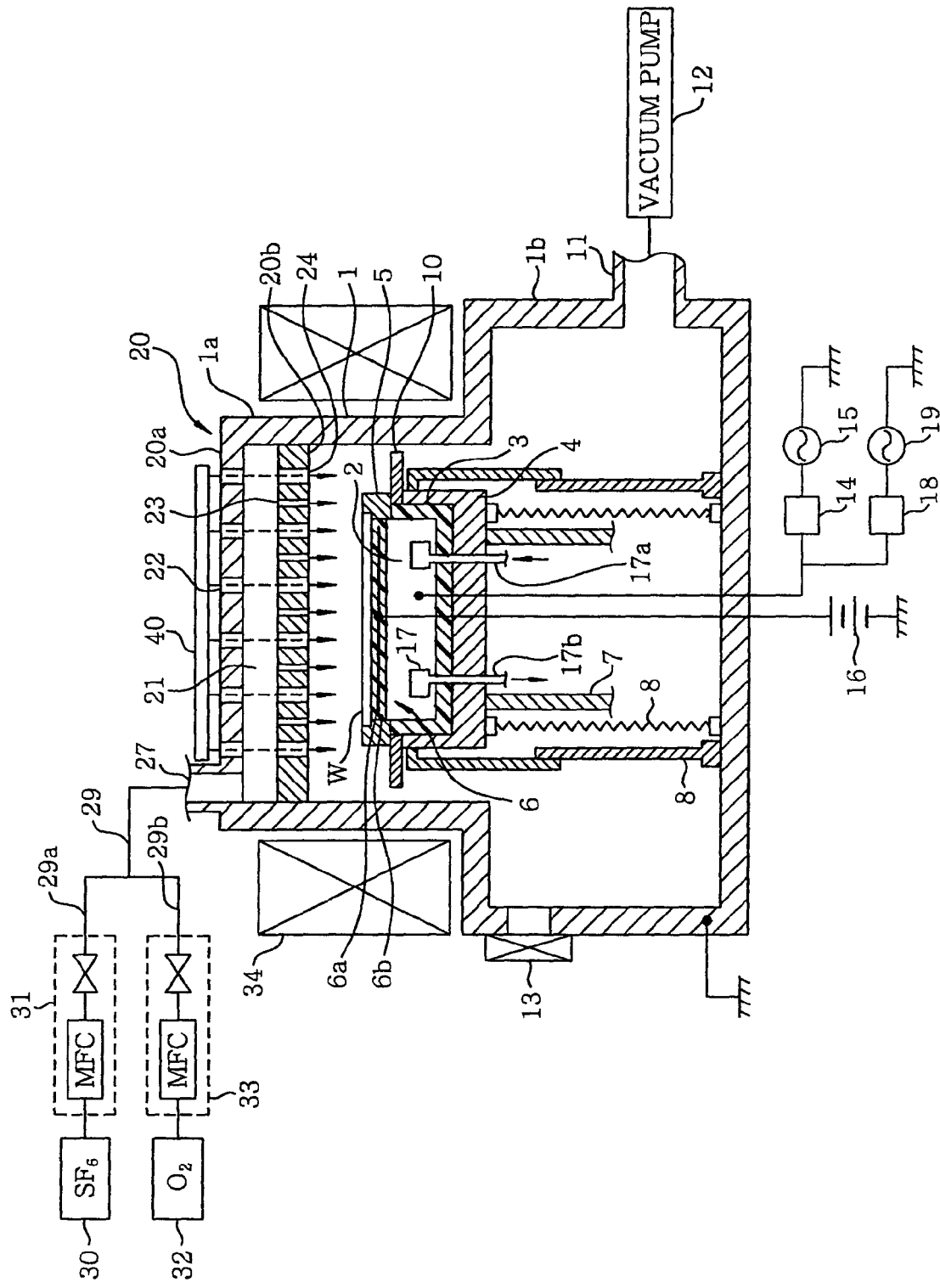
FIG. 1 shows a view showing an arrangement of a plasma etching apparatus for realizing a plasma etching method according to the present invention.

A plasma etching apparatus for explaining a plasma etching method will first be described in detail with reference to FIGS. 1 to 4. In this example, a magnetron RIE (Reactive Ion Etching) apparatus is used as a plasma etching apparatus. This etching apparatus has a stepped cylindrical process chamber (vacuum chamber) 1 made of, e.g., aluminum. The process chamber 1 is formed of two cylinders with different diameters that are connected to each other. The process chamber 1 has small-diameter upper chamber 1a and lower chamber 1b with a diameter larger than that of the upper chamber 1a. The process chamber 1 can be held in a vacuum state.

A support table 2 as a susceptor for horizontally holding a substrate to be processed W as an object to be processed is formed in the process chamber 1. The support table 2 is made of, e.g., aluminum and is supported by a support base 4 made of a conductor through an insulating plate 3. In addition, a focus ring 5 made of a material other than silicon, e.g., quartz, is formed on a periphery of the support table 2. The support table 2 and support base 4 can be vertically moved by a ball screw mechanism including ball screws 7. The driving portion of the ball screw mechanism below the support base 4 is covered with a bellows 8 made of stainless steel (SUS). A bellows cover 9 is formed outside the bellows 8. A baffle plate 10 is placed outside the focus ring 5.

Furthermore, the focus ring 5 is electrically connected to the process chamber 1 through the baffle plate 10, support base 4 and bellows 8. Moreover, the process chamber 1 is set at a GND potential.

An exhaust port 11 is formed in a side wall of the lower chamber 1b and the exhaust port 11 is connected to a vacuum pump 12. The vacuum pump 12 is actuated to reduce the pressure in the process chamber 1 to a predetermined vacuum degree. In addition, a gate valve 13 for loading/unloading the substrate to be processed W is formed in the upper portion of the side wall of the lower chamber 1b.

The support table 2 is connected to a plasma-generating first RF power supply 15 through a matching unit 14. The RF power supply 15 supplies RF power with a predetermined frequency to the support table 2. The support table 2 is connected to an ion-inducting second RF power supply 19 through a matching unit 18. The RF power supply 19 supplies RF power to the support table 2 with a frequency lower than that of the first RF power supply 15. In the meantime, a gas shower head 20, which will be described in detail, as a gas supply unit is formed above the support table 2. The gas shower head 20 is set parallel to the support table 2. The gas shower head 20 is set at the same GND potential as the process chamber 1. Thus, the support table 2 and the gas shower head 20 act as a pair of electrodes.

An electrostatic chunk 6 for chunking and holding the substrate to be processed W using an electrostatic force is formed on the surface of the support table 2. The electrostatic chunk 6 is formed by incorporating an electrode 6a in an insulator 6b. The electrode 6a is connected to a DC power supply 16. When the DC power supply 16 applies a voltage to the electrode 6a, an electrostatic force, e.g., the Coulomb force, is generated to attract and hold the substrate to be processed W.

The support table 2 has a refrigerant area 17 therein. A refrigerant is introduced to the refrigerant area 17 through a refrigerant inlet pipe 17a. The refrigerant is circulated in the refrigerant area 17 such that it is discharged through a refrigerant discharge pipe 17b. The cooling heat of the refrigerant is transferred to the substrate to be processed W from the lower side through the support table 2. Thus, the process surface of the substrate to be processed W is maintained at a desired temperature.

Figure 2A:
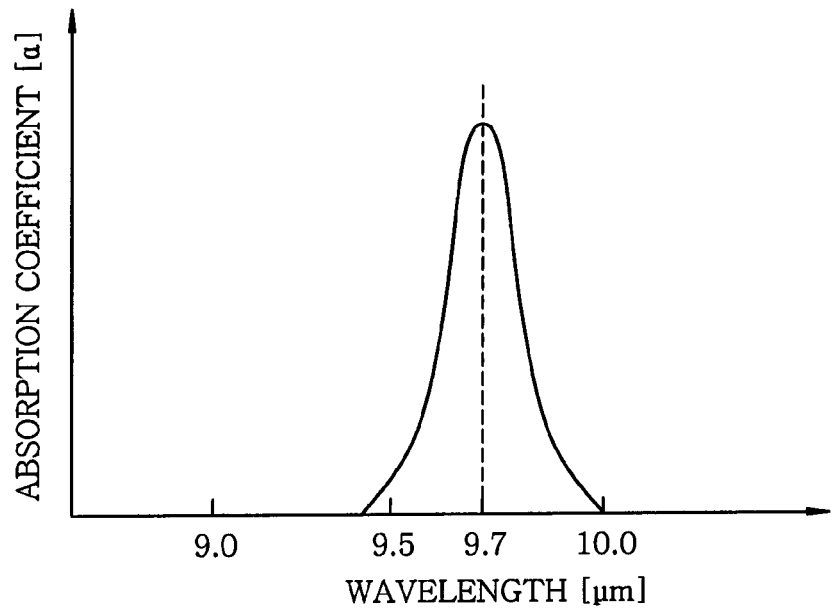
FIG. 2 describes a graph showing a light absorption spectrum of $SiF_4$ and $SF_6$.
Figure 2B:
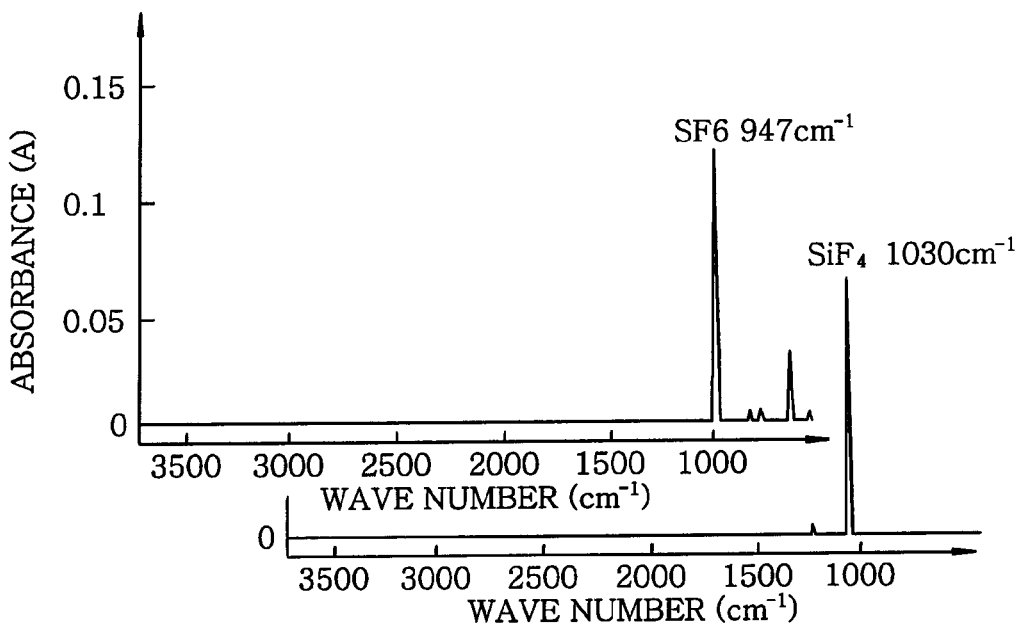

A light source 40 is formed above the gas shower head 20. A light source having peak intensity of light in a wavelength range of light absorption of an etching reaction product, e.g., $SiF_4$, formed during an etching is used as the light source 40. For example, a halogen lamp or a semiconductor laser can be used as the light source 40. In case that the etching reaction product is $SiF_4$, as shown in FIG. 2A, a light absorption spectrum of $SiF_4$ ranges from 9 μm to 10 μm. Thus, a peak intensity of light of the light source 40 must be included in the wavelength range. And FIG. 2B shows light absorption spectrums of $SF_6$ as an etching gas and $SF_4$ as the etching reaction product. The $SF_6$ and $SiF_4$ will be described hereinafter. As shown in FIG. 2B, the $SF_6$ and $SF_4$ show a peak absorbance in a range of wave number 947 cm−1 (wavelength 10.6 μm) and 1030 cm−1 (wavelength 9.7 μm) respectively. Also, in order to cover the round-shaped substrate on the support table 2, a plurality of bar-shaped lamps having almost same diameter as the substrate are installed in parallel.

Figure 3:
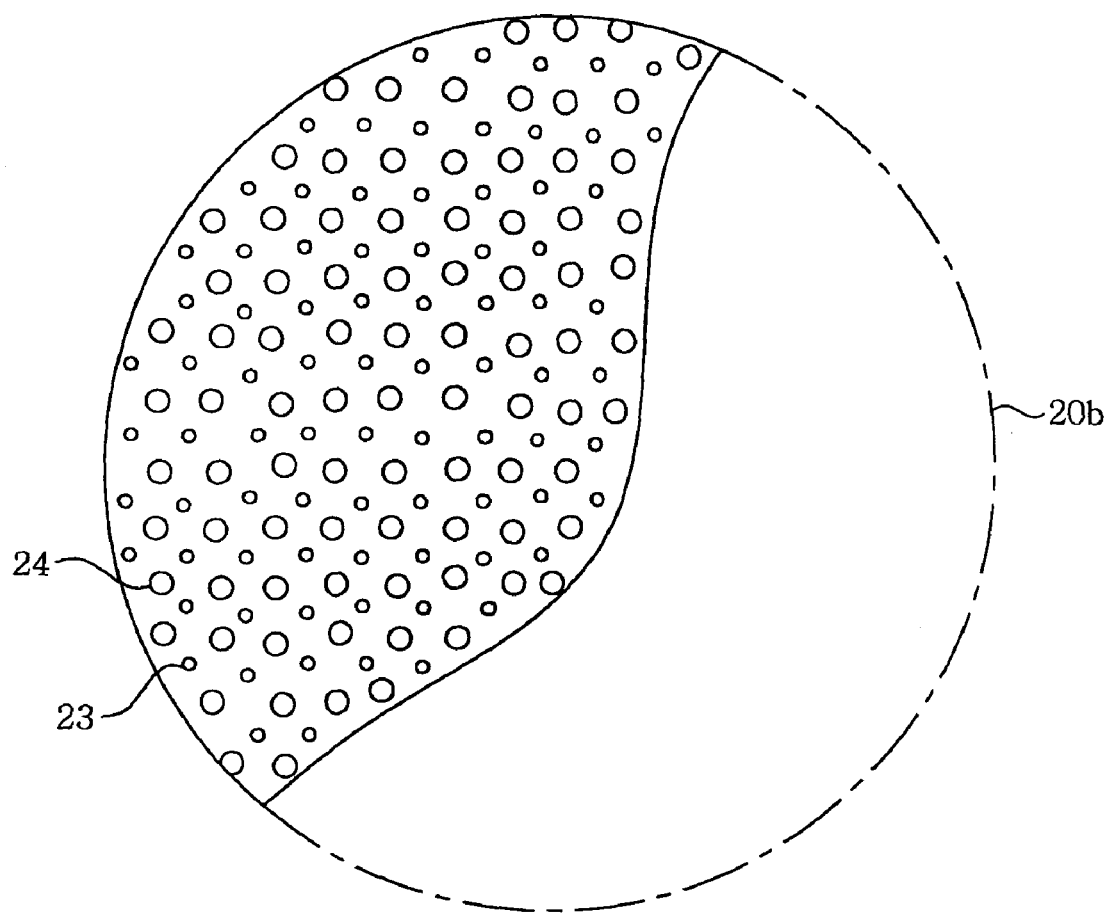
FIG. 3 depicts a perspective view showing a gas head formed in the plasma etching apparatus.

The gas shower head 20 is a hollow form of a flat cylindrical-shape. The gas shower head 20 has a diffusion space 21. The gas shower head is formed at the ceiling portion in the process chamber 1, to be parallel to the support table 2. As shown in FIG. 1 and FIG. 3, a large number of light transmitting windows 22, e.g., whose diameter ranges from 5 mm to 20 mm are formed in an upper surface 20a of the gas shower head 20. In addition, a large number of gas inlet holes 23, e.g., whose diameter ranges from 0.5 mm to 1 mm and a large number of light transmitting windows 24, e.g., whose diameter ranges from 5 mm to 20 mm are formed in a lower surface 20b of the gas shower head 20. The light transmitting windows 24 are parallel to the light transmitting windows 22. In the layout of the light source 40, a light from the light source 40 is set to be irradiated uniformly onto the substrate to be processed W.

Materials capable of transmitting a light at a high transmittance in a wavelength range of light absorption of an etching reaction product, e.g., $SiF_4$, formed during the etching, on the substrate to be processed W, are used for the light transmitting windows 22 and 24. For example, $BaF_2$, Ge, KCl, KBr, KRS-5, ZnSe and ZnS are used for the light transmitting windows 22 and 24. The light transmitting windows 22 and 24 may have a function of a band-pass filter, selectively transmitting a light in a wavelength range of light absorption.

In addition, a gas inlet portion 27 is formed at the one end of the upper surface 20a of the gas shower head 20. The gas inlet portion 27 is connected to a gas supply pipe 29 and the other end of the gas supply pipe 29 is branched off into a branch pipe 29a and 29b. A gas supply source 30 for a fluorine-containing compound gas, e.g., $SF_6$, is connected to the branch pipe 29a through a group of gas supply devices 31. A gas supply source 32 for an oxygen ($O_2$) gas is connected to the branch pipe 29b through a group of gas supply devices 33. The gas mixture of $SF_6$ and $O_2$ is used as a process gas (an etching gas). The etching gas flows via the gas supply pipe 29 and the gas inlet portion 27 to reach the diffusion space 21 in the gas shower head 20. The etching gas is then discharged from the gas inlet holes 23 into the process chamber 1. Also, the group of gas supply devices 31 and 33 include a mass flow controller such as a valve or a flow rate controller.

Figure 4:
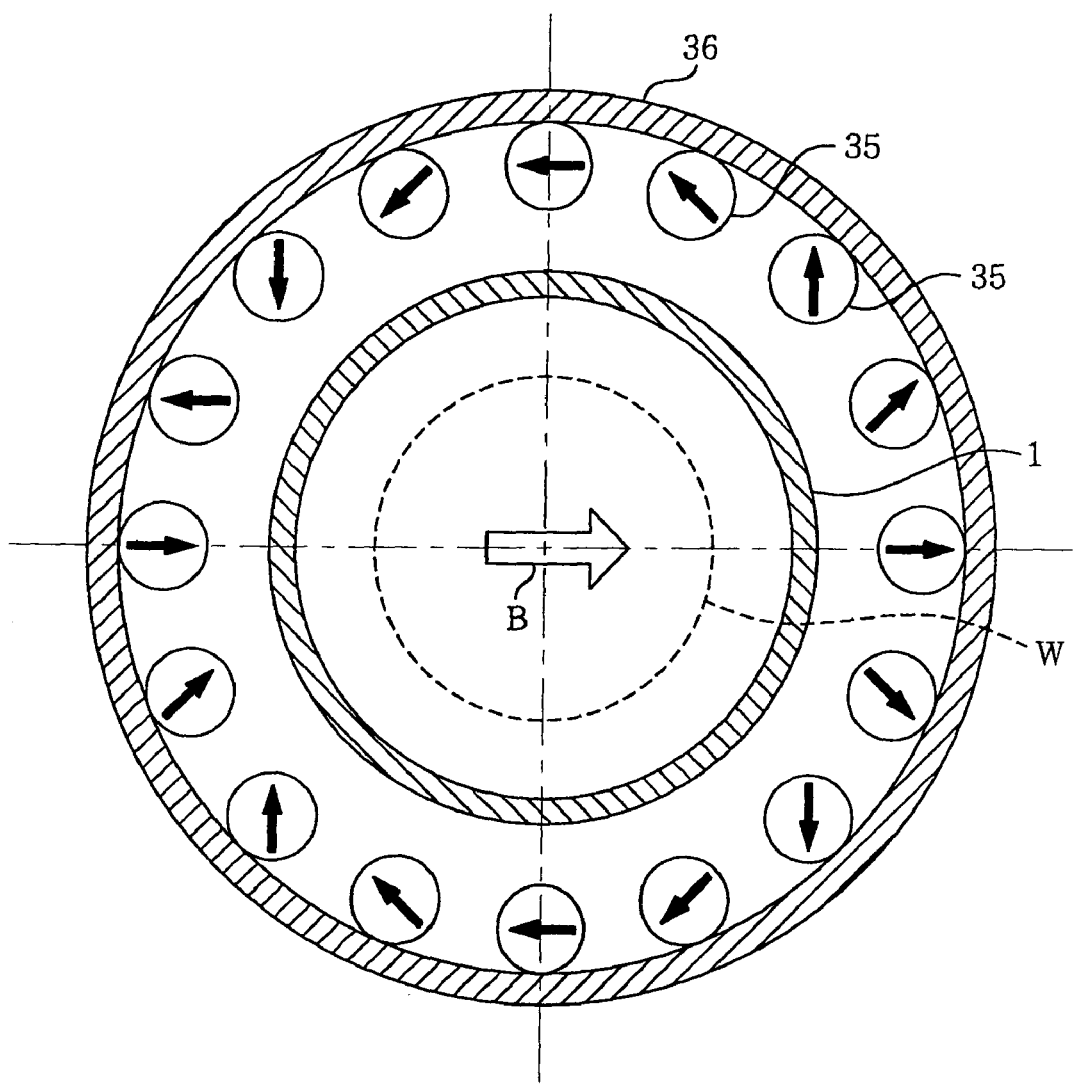
FIG. 4 illustrates a view schematically showing a dipole ring magnet arranged around a process chamber.

Meantime, a ring-shaped dipole ring magnet 34 is arranged around the upper chamber 1a. As shown in the horizontal sectional view of FIG. 4, the dipole ring magnet 34 is comprised by attaching a plurality of anisotropic segment columnar magnets 35 to a casing 36 formed of a ring-like magnetic body. In this example, 16 anisotropic segment columnar magnets 35 which form columns are arranged in the ring-like shape. In FIG. 4, arrows shown in the anisotropic segment columnar magnets 35 indicate the directions of magnetic fluxes. The directions of the magnetic fluxes of the plurality of anisotropic segment columnar magnets 35 are slightly shifted from each other to form a uniform horizontal magnetic field B, directed in one direction, as a whole.

Figure 5:
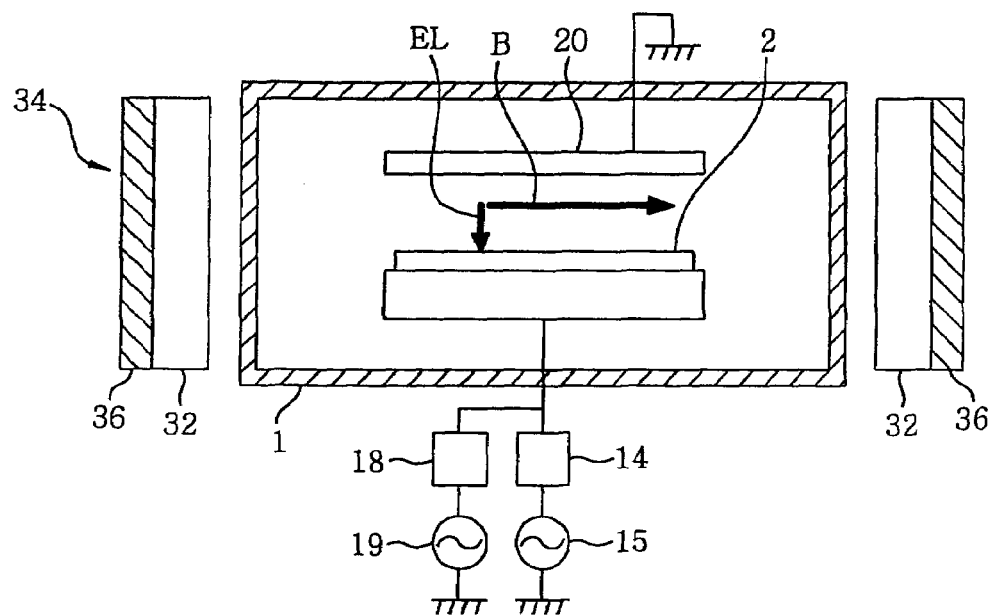
FIG. 5 offers a view for explaining an electric field and magnetic field formed in the process chamber.

Therefore, as schematically shown in FIG. 5, in the space between the support table 2 and gas shower head 20, upon application of the RF power from the first RF power supply 15, an electric field EL in the vertical direction along the upper and lower electrodes is formed. Also, the horizontal magnetic field B parallel to the direction along the upper and lower electrodes is formed by the dipole ring magnet 34. As a consequence of the orthogonal electromagnetic fields formed in this manner, a magnetron discharge is generated, which, in turn, generate plasma of the etching gas in a high-energy state.

The plasma etching method using the etching apparatus with the above arrangement will be described. Also, as the substrate to be processed W, a silicon substrate, e.g., in which circuit units are formed respectively is used. And after the silicon substrate is etched by a process described in here and thereafter, interconnections through holes are formed in the silicon substrate by a burying Copper and others, the substrate is made thin and then the substrates are stacked together to form a three dimensional package device.

Figure 6:
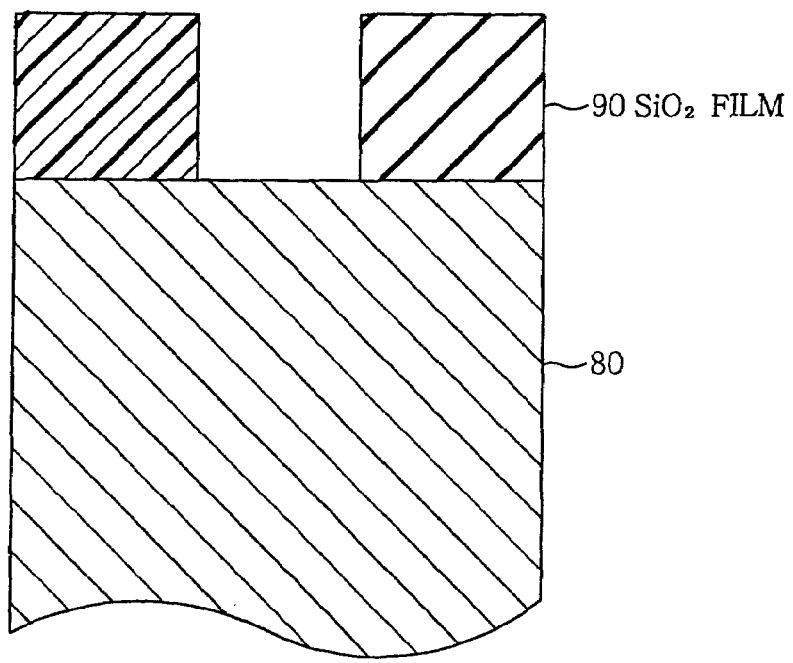
FIG. 6 provides a longitudinal cross sectional view showing a substrate to be processed loaded in the process chamber.

First, the gate valve 13 is open, and as shown in FIG. 6, the substrate to be processed W having, as its top layer, a silicon substrate 80 whose top surface is patterned with a silicon oxide film 90 ($SiO_2$ film) is loaded in the process chamber 1 and is placed on the support table 2. Thereafter, the support table 2 is moved upward to the position shown in FIG. 1 and the interior of the process chamber 1 is evacuated by the vacuum pump 12 through the exhaust port 11.

And, $SF_6$ gas is discharged from the gas supply source 30 into the process chamber 1 through the gas inlet holes 23 in the gas shower head 20 with a flow rate ranging from, e.g., 50 sccm (standard cubic centimeter per minute) to 1000 sccm and $O_2$ gas is discharged from the gas supply source 32 into the process chamber 1 through the gas inlet holes 23 in the gas shower head 20 with a flow rate ranging from, e.g., 0 sccm to 500 sccm. In addition, when $SF_6$ gas is used with $O_2$ gas, silicon oxide gets attached to a side wall of a recess portion in the silicon substrate, allowing the side wall to maintain its structural integrity, enhancing the etching anisotropy and improving the etching shape. And, the gas pressure in the process chamber 1 is set to, e.g., 13 Pa to 1,333 Pa (100 mTorr to 10 Torr), and in this gas atmosphere, RF power of, e.g., 40 Mhz is supplied to the support table 2 by the first RF power supply 15.

Meanwhile, RF power of, e.g., 3.2 Mhz is supplied to the support table 2 by the second RF power supply 19 in order to control the ion energy of the plasma. At this time, the DC power supply 16 applies a predetermined voltage to the electrode 6a of the electrostatic chunk 6, so that the substrate to be processed W is attracted to and held by the electrostatic chunk 6 with, e.g., the Coulomb force. Upon application of the RF power, an RF electric field is formed between the upper electrode, i.e., the gas shower head 20 (as the upper electrode) and the lower electrode, i.e., the support table 2 (as the lower electrode). The horizontal magnetic filed B is formed between the gas shower head 20 and the support table 2 by the dipole ring magnet 34.

Hence, orthogonal electromagnetic fields of, e.g., 17,000 µT (170 G) are formed in the process space between the electrodes where the substrate to be processed W is located. The drift of electrons caused by the orthogonal electrostatic field causes a magnetron discharge. The magnetron discharge, in turn, converts $SF_6$ gas and $O_2$ gas into a plasma, and fluorine radicals (F*) in the plasma state etch the silicon substrate 80 in the direction of thickness.

At this time, as shown in the following reaction equation 2, $SiF_4$ is created by a reaction between fluorine radicals and Si. In addition, as shown in the following reaction equation 3, as a consequence of $SF_4$, Si and $O_2$ reacting with each other, $SiF_4$ and $SO_2$ are also created as a part of the etching reaction. Regardless, $SiF_4$ is the major etching reaction product in the etching reaction.

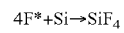  [Reaction Equation 2]

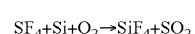  [Reaction Equation 3]

In the meantime, as described above, a light having peak intensity of light in a wavelength range of light absorption of $SiF_4$, e.g., from 9 µm to 10 µm, is irradiated on a surface of the silicon substrate 80 through the light transmitting windows 22 and 24.

Figure 7A:
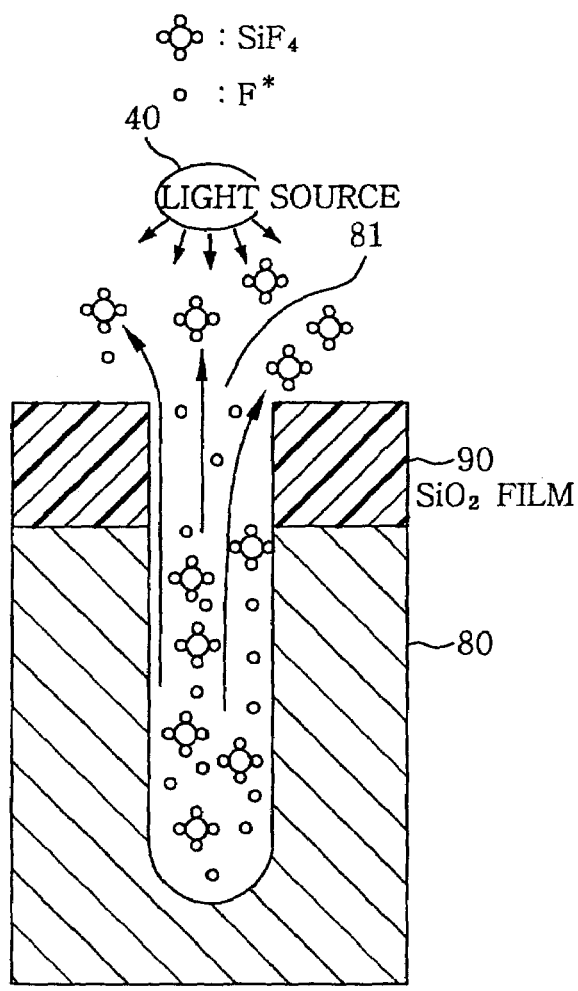
FIG. 7 presents a schematic diagram for explaining an example of a plasma etching method according to the present invention.

FIG. 7a presents a schematic diagram for explaining an example of a plasma etching method according to the present invention whereby an interconnection through hole 81 is being formed by a conducting etching with an active species including fluorine radicals (F*) while the light is irradiated onto the silicon substrate 80. As shown in above reaction equation 2, the $SiF_4$ is formed by the reaction of the fluorine radicals and the Si.

Figure 7B:
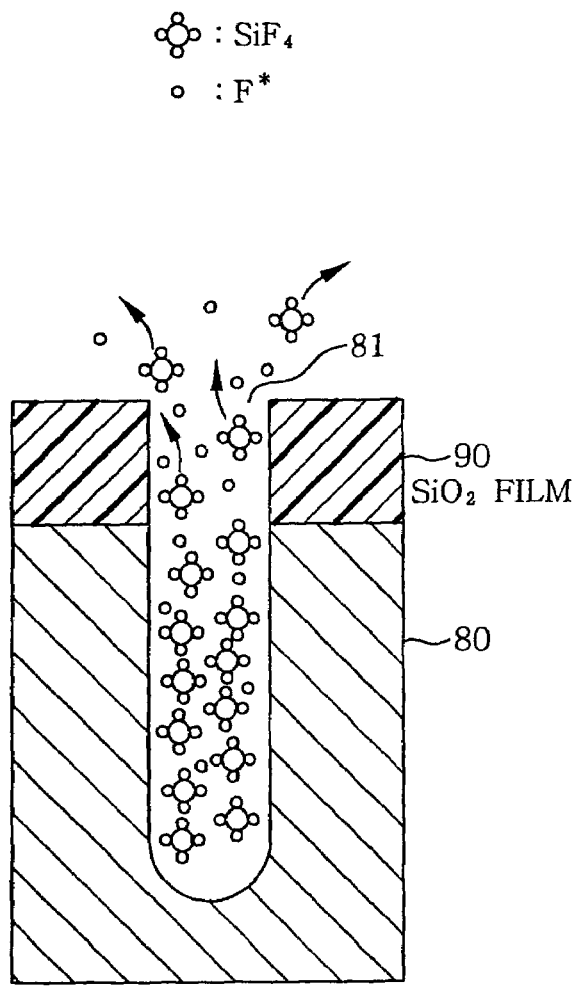

Thus formed $SiF_4$ is activated by absorbing a light whose wavelength is from 9 µm to 10 µm and therefore, a kinetic energy thereof becomes high, allowing an easy escape for $SiF_4$ from the hole 81. Furthermore, FIG. 7B is a schematic diagram for explaining an example of a plasma etching method, wherein the etching is conducted in the same manner with an exception of irradiating the light on the surface of the silicon substrate 80. In this case, as shown in FIG. 7b, because the kinetic velocity of the $SiF_4$ molecules exhausted from the hole 81 is smaller than that of the $SiF_4$ molecules on which the light is irradiated, the $SiF_4$ molecules stay inside the hole 81 for a longer period of time.

According to above example, the silicon substrate 80 is etched mainly by fluorine radicals (F*) which are obtained by converting the $SF_6$ gas and oxygen gas in a plasma, and at the same time, by irradiating the etching reaction product on the surface of the silicon substrate 80, i.e., $SiF_4$, with a light in a wavelength range of light absorption thereof, whose wavelength, to be more precise, ranges from 9 µm to 10 µm, allowing the etching reaction product to absorb the light, be activated and gain kinetic energy to be used in promptly escaping from the hole 81. Thus, because an amount (a partial pressure) of the $SiF_4$ can be decreased in the hole 81, an amount (a partial pressure) of the fluorine radicals (F*) can be increased and this will result in an etching rate of the silicon substrate 80 being increased.

This exemplary method is especially ideal for a case where a hole whose aspect ratio is more than 2 and whose diameter is less than 100 µm, because for such a case, a high-rate etching of more than 30 µm/min can be achieved.

The present invention is not limited to the above embodiment, but can be modified in various manners. For example, a position of the light source 40 is not limited to a position in an atmosphere outside the process chamber 1 and the light source 40 can be placed in a vacuum atmosphere inside the process chamber 1. In addition, a configuration of the hole part is not limited to the through hole and may be a hole on a bottom. Moreover, various types of plasma etching apparatuses such an induction coupling type apparatus or an apparatus using microwave other than a parallel plates-shaped capacitance coupling type apparatus can be used.

In addition, a plasma etching method of the present invention has been explained using, as an example, the $SF_6$ gas and $O_2$ gas as an etching gas but, the same operation and effect can be seen for the case in which $S_2F_{10}$ gas and $O_2$ gas are used as the etching gas because the major etching reaction product therefrom is also $SiF_4$. In this case, the $S_2F_{10}$ gas is provided from the gas supply source 30 into the process chamber 1 in an apparatus shown in FIG. 1.

Also, in the present invention, although a light having peak intensity of light in wavelength range from 9 µm to 10 µm is irradiated onto the substrate, a light having peak intensity of light in a wavelength of light absorption of the $SF_6$ molecule at 10.6 µm may simultaneously be irradiated therewith.

While the invention has been shown and described with respect to the preferred embodiments, it will be understood by those skilled in the art that various changes and modifications may be made without departing from the scope of the invention as defined in the following claims.

What is claimed is:

1. A plasma etching method, comprising the steps of:
converting a process gas including a fluorine-containing compound gas into a plasma; and
etching a silicon portion of an object to be processed with the plasma,
wherein a light having a peak intensity of light in a wavelength range of light absorption of a reaction product produced by the etching is irradiated onto a surface of the object to be processed wherein, the process gas is introduced into a chamber by a gas supply unit, the gas supply unit including a plurality of light transmitting windows for transmitting the light from a light source, and the light transmitting windows being formed in a surface of the gas supply unit facing the object and in a surface of the gas supply unit facing the light source, and wherein the light is irradiated uniformly onto the whole surface of the object through the light transmitting windows.

2. The plasma etching method of claim 1, wherein the reaction product is silicon tetrafluoride (SiF4) and the wavelength range of light absorption is from 9 µm to 10 µm.

3. The plasma etching method of claim 1, wherein the fluorine-containing compound gas includes at least one of SF6 and S2F10.

4. The plasma etching method of claim 2, wherein the fluorine-containing compound gas includes at least one of SF6 and S2F10.

5. The plasma etching method of claim 1, wherein the process gas includes oxygen gas.

6. The plasma etching method of claim 2, wherein the process gas includes oxygen gas.

7. The plasma etching method of claim 3, wherein the process gas includes oxygen gas.

8. The plasma etching method of claim 4, wherein the process gas includes oxygen gas.

* * * * *